United States Patent
Kulkarni et al.

(10) Patent No.: US 12,081,952 B2
(45) Date of Patent: Sep. 3, 2024

(54) SYSTEM AND METHODS TO RESHAPE FAN NOISE IN ELECTRONIC DEVICES

(71) Applicant: Intel Corporation, Santa Clara, CA (US)

(72) Inventors: Shantanu D. Kulkarni, Hillsboro, OR (US); Jeff Ku, Taipei (TW); Sumod Cherukkate, Bangalore (IN); Tongyan Zhai, Portland, OR (US); Srikanth Potluri, Folsom, CA (US); Jordan E. Maslov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 17/111,130

(22) Filed: Dec. 3, 2020

(65) Prior Publication Data
US 2021/0092517 A1    Mar. 25, 2021

(51) Int. Cl.
| | |
|---|---|
| H04R 3/04 | (2006.01) |
| G10K 11/175 | (2006.01) |
| H04R 1/22 | (2006.01) |
| H05K 7/20 | (2006.01) |

(52) U.S. Cl.
CPC ............ *H04R 3/04* (2013.01); *G10K 11/175* (2013.01); *G10K 11/1752* (2020.05); *H04R 1/222* (2013.01); *H05K 7/20* (2013.01)

(58) Field of Classification Search
CPC . H04R 3/04; H04R 1/222; H05K 7/20; G10K 11/1752; G10K 11/175
USPC ...................................................... 381/71.14
See application file for complete search history.

(56) References Cited

U.S. PATENT DOCUMENTS

| | | | |
|---|---|---|---|
| 2009/0129936 A1* | 5/2009 | Yokoyama | F04D 25/0633 318/35 |
| 2019/0166802 A1* | 6/2019 | Seltzer | A01K 27/001 |
| 2019/0310694 A1* | 10/2019 | Davis | G01K 13/00 |

FOREIGN PATENT DOCUMENTS

WO        9302445       2/1993

OTHER PUBLICATIONS

European Patent Application, "The Extended European Search Report," issued in connection with EP Patent application No. 21198568.4, mailed on Jun. 7, 2022, 11 pages.
European Patent Office, "Partial European Search report", issued in connection with EP patent application No. 21198568.4, Mar. 4, 2022, 11 pages.
European Patent Office, "Communication pursuant to Article 94(3) EPC," issued in connection with European patent Application No. 21198568.4-1207/4009141, dated Apr. 30, 2024, 4 pages.

* cited by examiner

*Primary Examiner* — Vivian C Chin
*Assistant Examiner* — Douglas J Suthers
(74) *Attorney, Agent, or Firm* — HANLEY, FLIGHT & ZIMMERMAN, LLC

(57) ABSTRACT

Systems, apparatus, articles of manufacture, methods are disclosed to reshape fan noise of a fan of an electronic device. An example system includes a microphone to detect a first acoustic signal including fan noise. The example system also includes a processor to: identify a tone in the first acoustic signal; and determine a gain to add to the first acoustic signal to mask the tone. In addition, the example system includes a sound transducer to present a second acoustic signal including the gain.

26 Claims, 16 Drawing Sheets

SYSTEM AND METHODS TO RESHAPE FAN NOISE IN ELECTRONIC DEVICES

BACKGROUND

Some electronic devices reduce the noise level created by fans by using a thicker fan design with a larger, quieter blower. Also, some electronic devices reduce the noise level created by fans by capping performance of the electronic device to require lower cooling needs.

Figure 1:
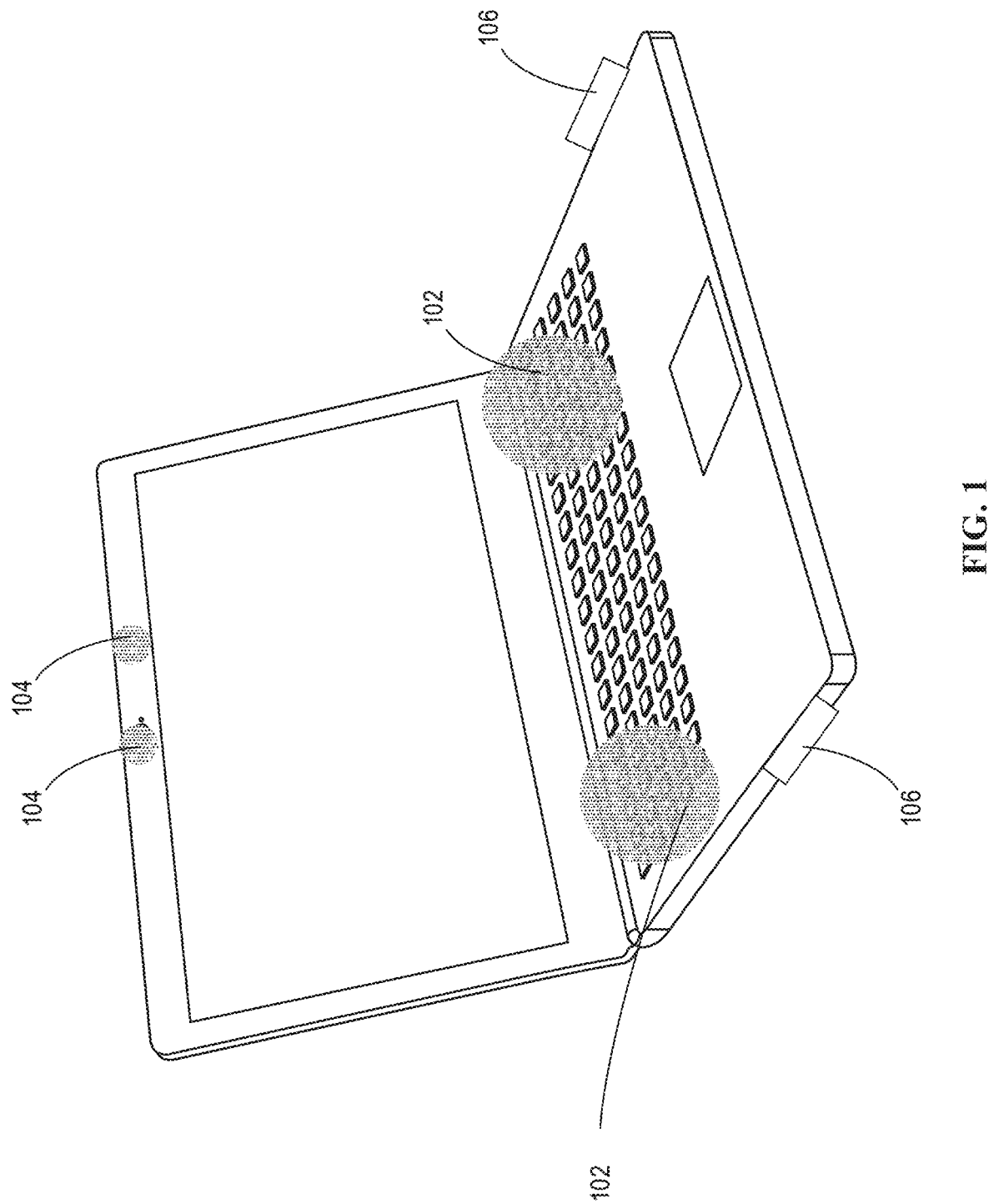
FIG. 1 is a schematic illustration of an example electronic device.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part.

As noted above, a first part can be above or below a second part with one or more of: other parts therebetween, without other parts therebetween, with the first and second parts touching, or without the first and second parts being in direct contact with one another. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc. are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time +/−1 second.

DETAILED DESCRIPTION

Electronic devices such as, for example, laptops or notebooks use fans or blowers for cooling, which allow the systems to run at higher power and achieve increased performance. However, the fans create acoustic noise. Users of the electronic devices often find acoustic fan noise very irritating, particularly when the electronic device is running heavy workloads that cause increased operation of the fans.

Aspects of acoustic noise that are problematic or irritating include the level (or volume) of the noise and the harshness (or quality) of the noise. In addition, human perception of noise also varies based on the profile of the color of the noise.

The examples disclosed herein modify acoustic noise produced by fans in electronic devices. In the context of this patent modifying noise includes abating, blending, cancelling, flattening, controlling, reducing, smoothing, spreading out, deducting, masking, reshaping, recoloring, or otherwise changing noise produced by fans in electronic devices. These terms may be used interchangeably throughout. These examples control the noise characteristics of the fans for improved human perception. Because the fan noise is controlled, the examples disclosed herein enable electronic devices to operate at a higher power with increased fan operation and noise without causing discomfort to the human users. Thus, the control of the noise characteristics further enable higher system performance.

FIG. 1 is a schematic illustration of an example electronic device 100. The electronic device 100 of FIG. 1 is a laptop or notebook computer. In other examples, the electronic device 100 may be any type of electronic device that includes a fan or blower or other type of device or component that produces noise. The electronic device 100 of the illustrated example includes two fans 102. FIG. 1 shows the position of the fans 102 within the interior of the electronic device 100. Though two fans 102 are shown, in other examples, there may be a different number of fans including, for example, one, three, etc. In addition, the positions of the fans 102 may be in any position in the electronic device 100.

The electronic device 100 also includes example microphones 104. The microphones 104 are the standard, system, or main microphones. These main microphones 104 are used, for example, to detect acoustic signals from a user speaking. Though two main microphones 104 are shown in the illustrated example of FIG. 1, in other examples, there may be a different number of main microphones including, for example, one, three, etc. In addition, the positions of the main microphones 104 may be in any position in the electronic device 100.

The electronic device 100 also includes example speakers 106. The speakers 106 are the standard, system, chassis, or main speakers. These main speakers 106 are used, for example, to present, deliver or otherwise output acoustic signals from the electronic device 100 including, for example, acoustic media for consumption by the user. Though two main speakers 106 are shown in the illustrated example of FIG. 1, in other examples, there may be a different number of main speakers including, for example, one, three, etc. In addition, the positions of the main speakers 106 may be in any position in the electronic device 100.

Figure 2:
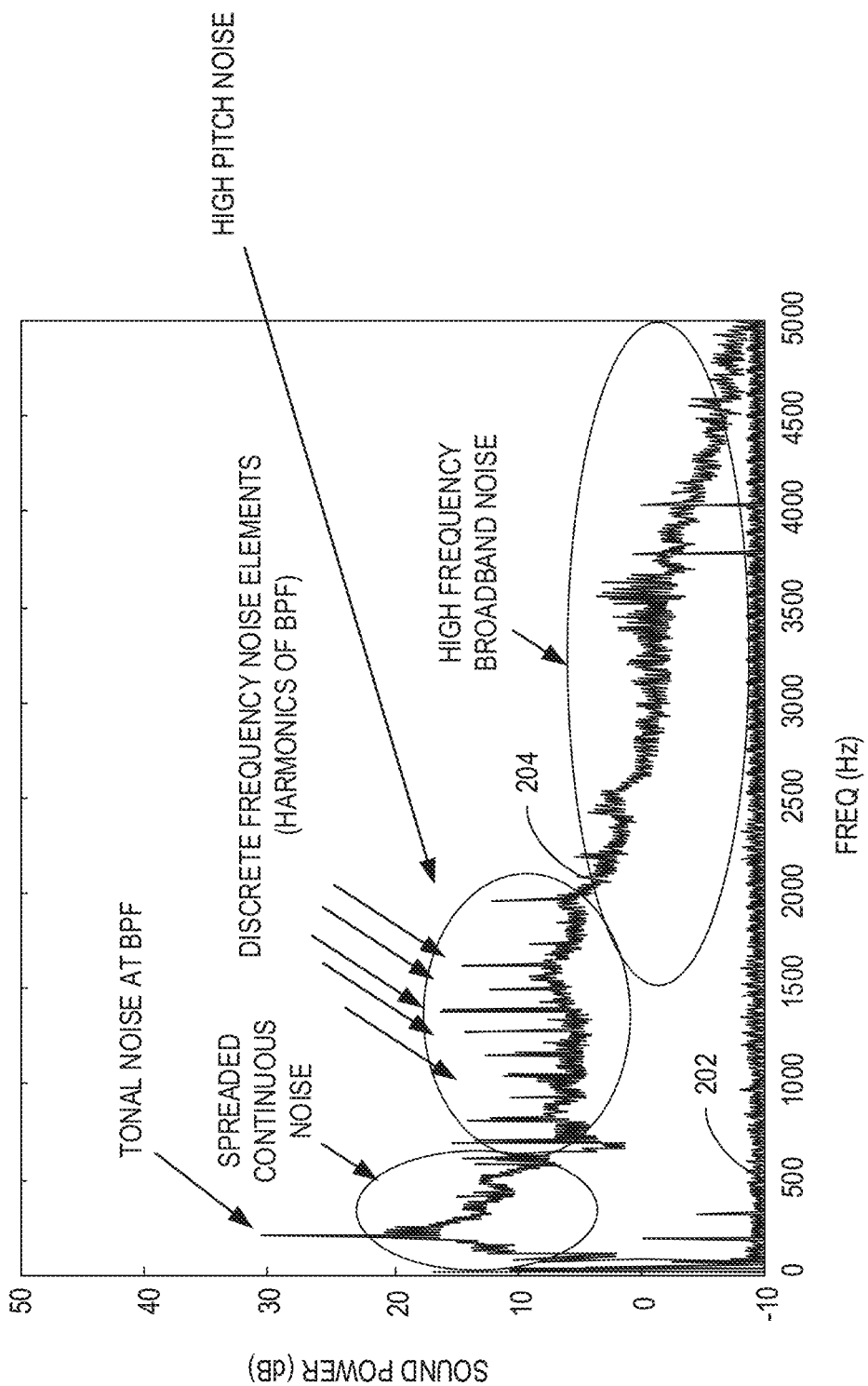
FIG. 2 is a plot of an example noise spectrum of an example fan of an example electronic device.

FIG. 2 is a plot of an example noise spectrum of an example fan of an example electronic device. For example, one or both of the fans 102 of the electronic device 100 FIG. 1 may produce the acoustic signal shown in the plot of FIG. 2. In the plot of FIG. 2, background noise 202 is shown along the bottom of the plot at or near approximately −10 decibels (dB). Typical fan noise is shown with the example acoustic signal 204. This fan noise may be produced, for example, by the fan 102 of the electronic device 100. In this example, there are high pitch tones appearing in the acoustic signal 204 between about 1000 hertz (Hz) and about 2000 Hz. These high pitch tones are irritating to a human. In other examples, the acoustic signal 204 may have low pitch tones that are irritating a human. For example, low pitch tones from about 10 Hz to about 200 Hz may be irritating to people. The low pitch tone may be produced by one or more of the components of the electronic device 100. Though, some examples disclosed herein are discussed in terms of masking a high tone, these examples may be used to flatten the acoustic signal and mask the high pitch tones and/or low pitch tones.

Figure 3:
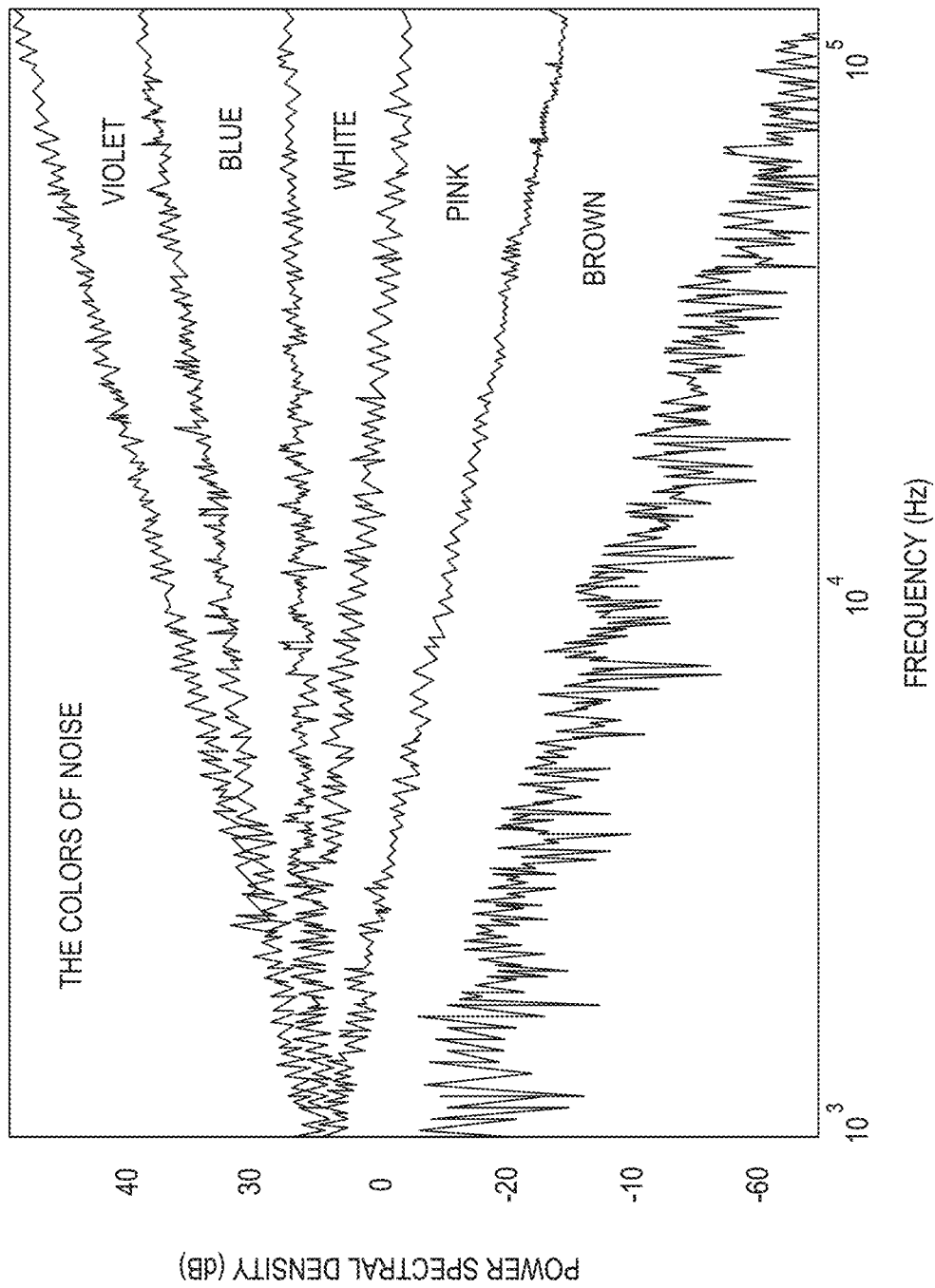
FIG. 3 is a plot of example power spectral densities as a function of frequency illustrative of different colors of noise.

FIG. 3 is a plot of example power spectral densities as a function of frequency illustrative of different colors of noise. Color of noise refers to the power spectrum of the noise signal. Different colors of noise sound different to human ears. The examples disclosed herein can be used to recolor or otherwise alter the acoustic signal toward pink noise for better human perception. In some examples, as disclosed herein, energy is added to the acoustic signal 204 to recolor the acoustic signal 204.

Figure 4A:
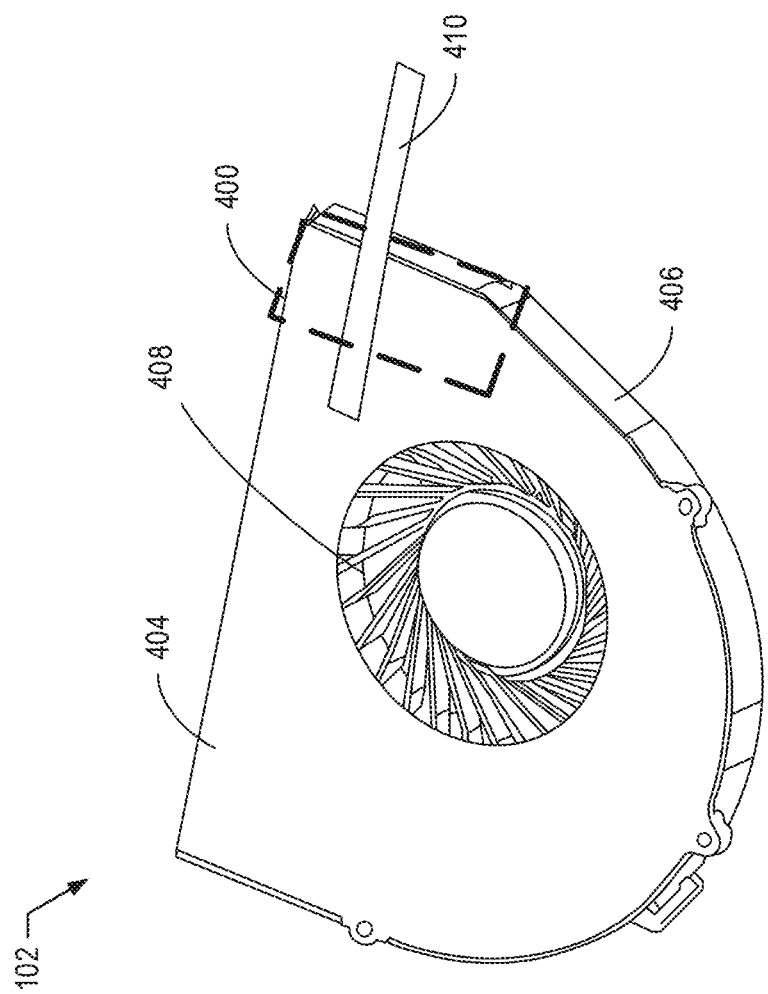
FIG. 4A is a top, perspective view of an example fan of the electronic device of FIG. 1 showing a position of an example sound transducer.
Figure 4B:
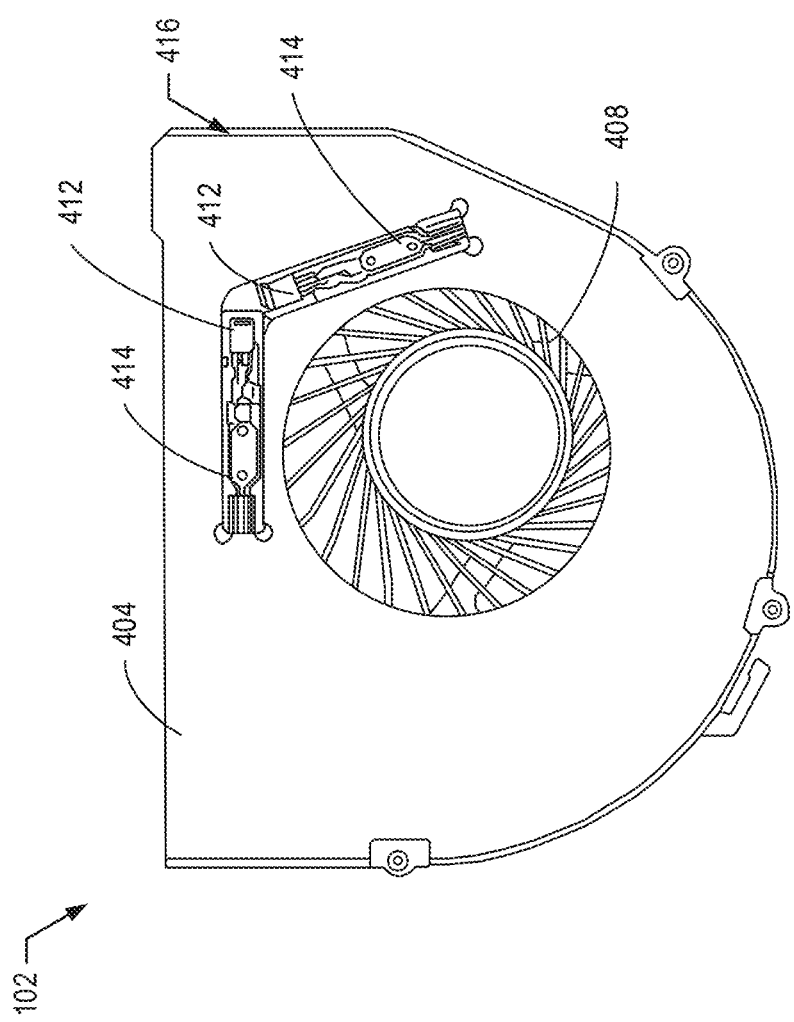
FIG. 4B is a top view of the fan of FIG. 4A showing two example microphones in the example fan housing.
Figure 4C:
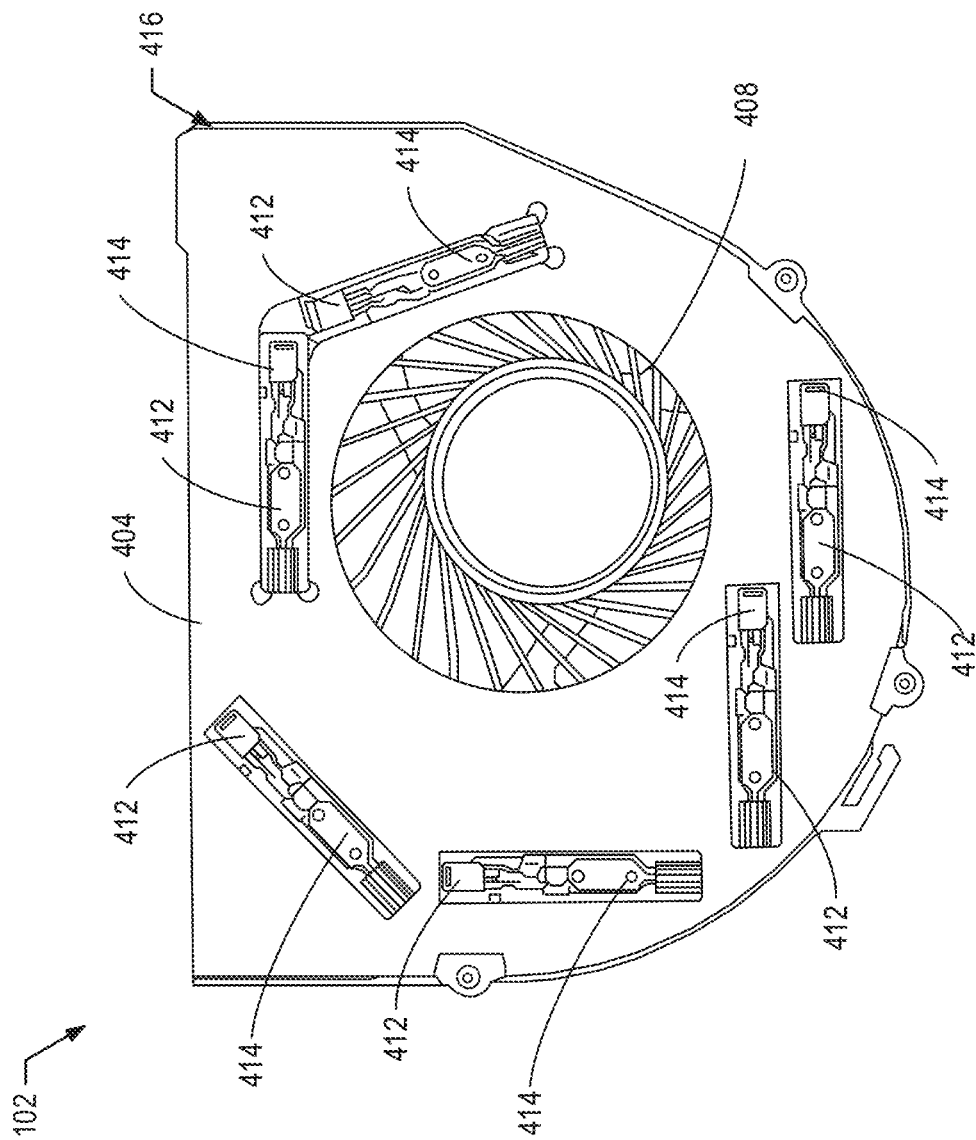
FIG. 4C is a top view of the fan of FIG. 4A showing six example microphones in the fan housing.
Figure 4D:
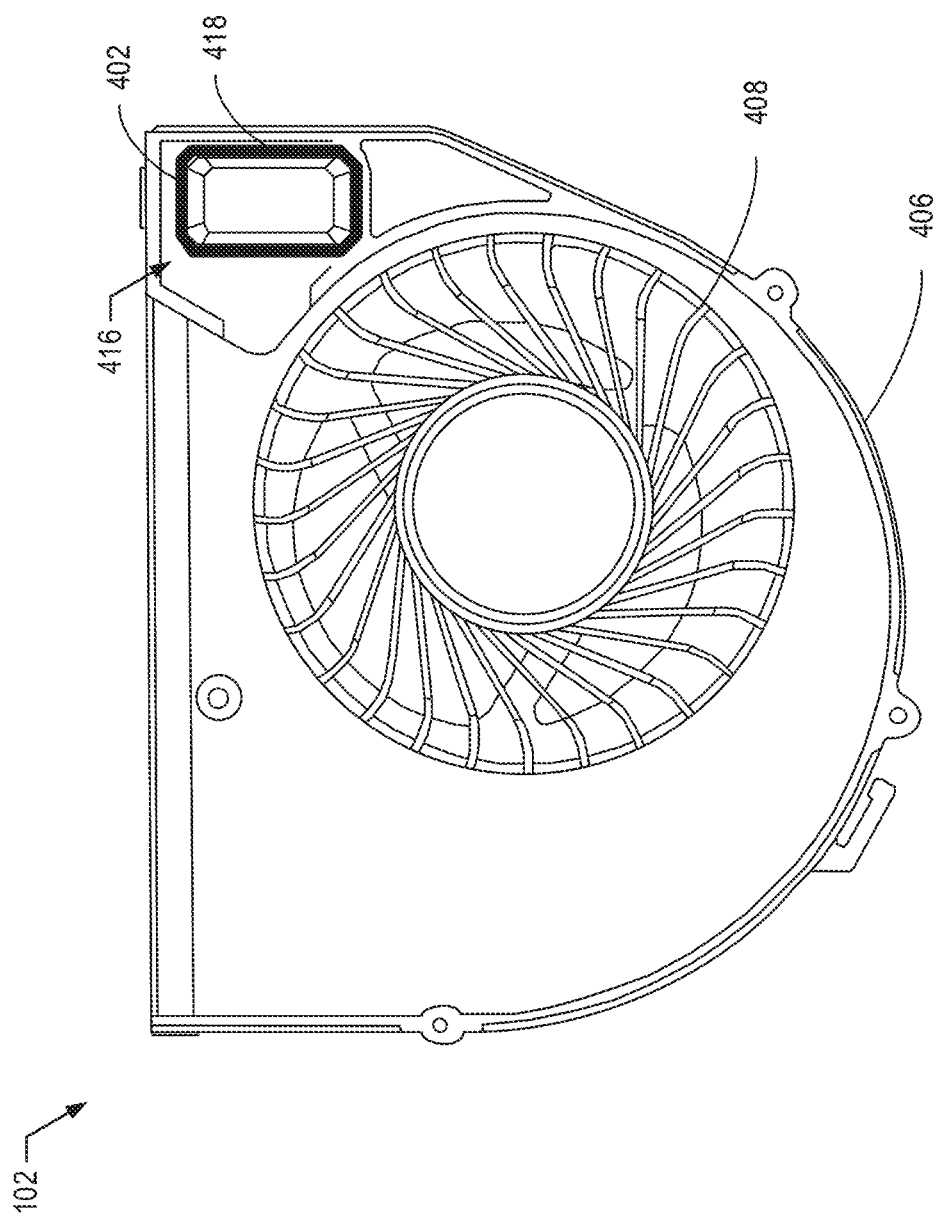
FIG. 4D is a top view of the fan of FIG. 4A with a top plate removed and showing an example sound transducer.
Figure 4E:
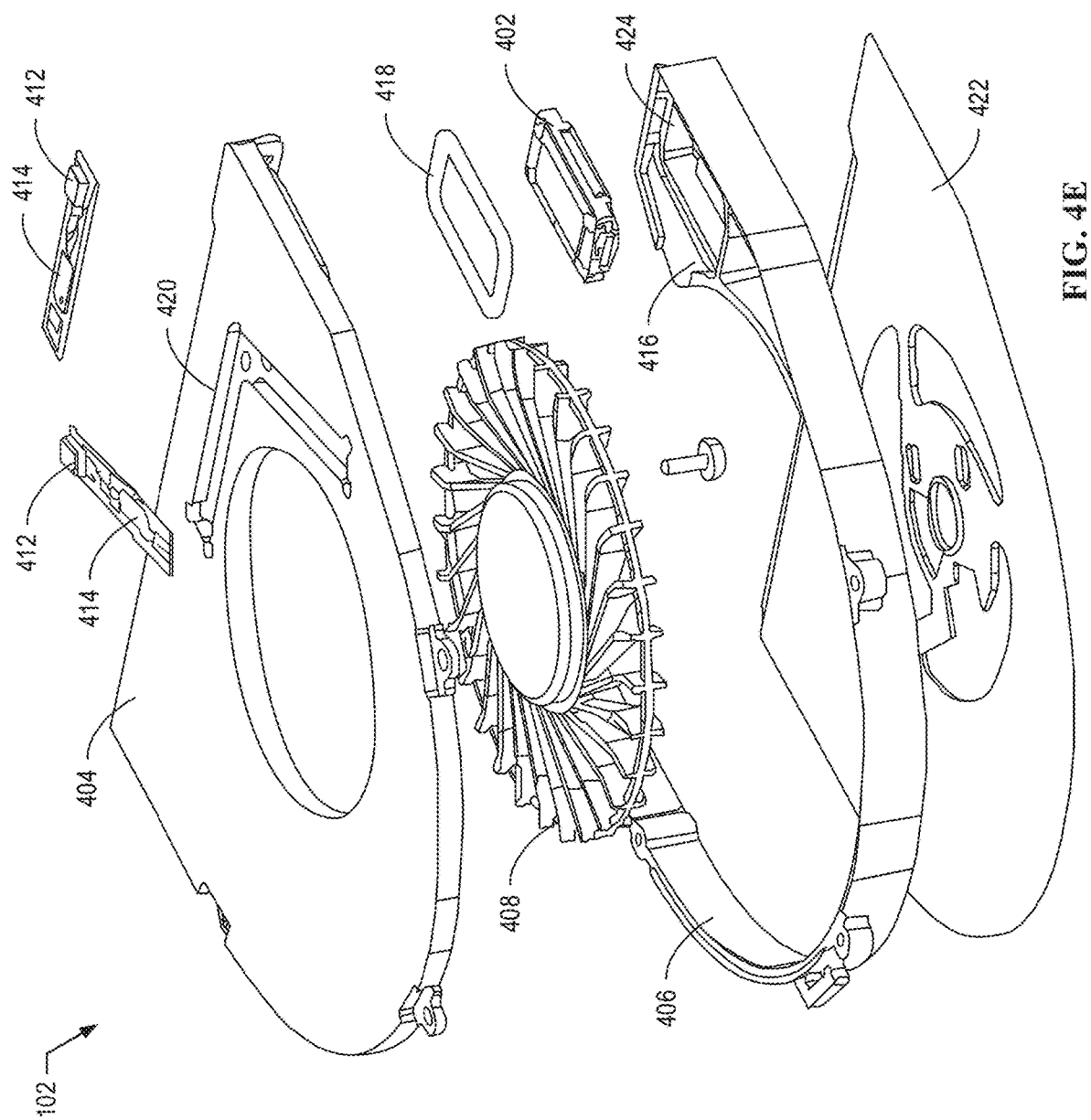
FIG. 4E is an exploded view of the fan of FIG. 4A.

FIG. 4A is a top, perspective view of the example fan 102 of the electronic device 100 of FIG. 1 showing a position 400 of an example sound transducer 402 (see FIGS. 4D and 4E). The fan 102 includes an example cover or top plate 404 and an example housing 406. In some examples, the fan top plate 404 has a thickness of about 0.5 millimeters (mm). The fan 102 also includes fan blade 408. The top cover 404 and the housing 406 protect the fan blade 408 from foreign objects such as, for example, dust or minimizes the effect of foreign objects on the fan blade 408. The fan blade 408 produces an air flow when rotated to dissipate heat generated by components of the electronic device 100.

The fan 102 also includes lead wires that connect the fan 102 to other components of the electronic device 100. In the illustrated example of FIG. 4A, the lead wires are embodied on a flexible printed circuit (PFC) 410. The PFC 410 communicatively couples the fan 102 to, for example, processing components such as, for example, one or more of the components of FIG. 6.

FIG. 4B is a top view of the fan 102 of FIG. 4A showing two example microphones 412 in the top plate 404. To distinguish the main microphones 104, the microphones 412 in the top plate 404 of the fan 102 are referred to as fan microphones in this description. However, in the claims, the components may be referred as microphones. The fan microphones 412 gather acoustic signals from the fan 102. In some examples, the fan microphones 412 are coupled to microphone boards 414, which are flexible circuit boards that couple the fan microphones 412 to the PFC 410. In the illustrated example, the fan microphones 412 are located in the cutwater feature or region 416 of the fan 102 (see also FIG. 4E). The cutwater region 416 is the tongue feature on the fan 102. The cutwater region 416 is used for air compression and is where the fan noise is mainly generated. In some examples, the cutwater region 416 is where the maximum or peak noise is observed. In some examples, the fan microphones 412 also are used to monitor the system component noises inside the chassis of the electronic device 100, such as, for example if the fan noise pattern is abnormal due to dust or rotor failure. In some examples, the fan microphones 412 measure other high frequency noise in the electronic device 100. For example, the fan microphones 412 can listen to the system noises such as, for example, singing capacitors, power supplies, and/or noises or other components that degrade the signal-to-noise ratio of the main microphones 104. Thus, analysis and manipulation of the acoustic signals gathered by the fan microphones 412 facilitate improvement of the quality of the main microphones 104.

Though two fan microphones 412 are shown in the example of FIG. 4B, in other examples other numbers of fan microphones 412 may be used such as, for example, one, three, four, etc. In other examples, there could be more. For example, the fan 102 in the example of FIG. 4C includes six fan microphones in the top plate 404. In the example of FIG. 4C, the fan microphones 412 are arranged around the fan blade 408. In some examples, one or more of the fan microphones 412 are arranged at a tangent to the fan blade 408. Other arrangement and orientations of the fan microphones 412 could be implemented.

FIG. 4D is a top view of the fan 102 of FIG. 4A with the top plate 404 removed. The view of FIG. 4D shows the sound transducer 402. In the illustrated example, the sound transducer 402 is a speaker such as, for example, a dynamic speaker or speaker driver. The sound transducer 402 delivers acoustic energy or signals to reshape the fan noise. In some examples, the sound transducer 402 is adjacent to and/or surrounded by an example speaker surround or sponge 418. The speaker sponge 418 mitigates or dampens the effect of vibration when the sound transducer 402 operates.

As disclosed below, the fan microphones 412 detect the fan noise, which is analyzed to identify high pitch tones or noise and/or harsh noise. The analysis includes application of an algorithm to generate a noise reshaping signal that can be used to blend, spread out or reshape the high pitch noise for better human perception. The noise reshaping signal that is used to reshape the fan noise is generated by the sound transducer 402. The reshaped fan noise masks the high pitch tones and is more aesthetically pleasing to the user. In the illustrated example, the sound transducer 402 is located in the cutwater region 416 to facilitating directing the noise reshaping signal at the noise source in the cutwater region to control, cancel, and/or reshape the noise at the source.

FIG. 4E is an exploded view of the fan 102 of FIG. 4A. The top plate 404 includes a recess 420 to house the fan microphones 412 and microphone boards 414. In the illustrated example, there is one recess 420 that houses two fan microphones 412. In other examples, there are additional fan microphones included in the recess 420. In other examples, each fan microphone 412 has its own recess 420. The fan 102 also includes a bottom plate 422. In some examples, the fan microphones 412 and microphone boards 414 are coupled to or located in the bottom plate 422.

The fan housing 406 includes a recess 424 for the sound transducer 402. In this example, the recess 424 is in the cutwater region 416 so that the sound transducer 402 is close to the source of the fan noise or the main source or area of the fan noise. In addition, in the illustrated example, the cutwater region 416 of the fan housing 406 is made of non-functional plastic walls. In some examples, placement of the sound transducer 402 in the cutwater region 416 does not require increasing the size of the fan 102. In some examples, the fan 102 may have a 3-5 mm width increase. In other examples, the size of the sound transducer 402 is decreased to avoid alteration in the width of the fan 102. Also, in some examples, the sound transducer 402 may be placed external and adjacent the fan 102.

Figure 5A:
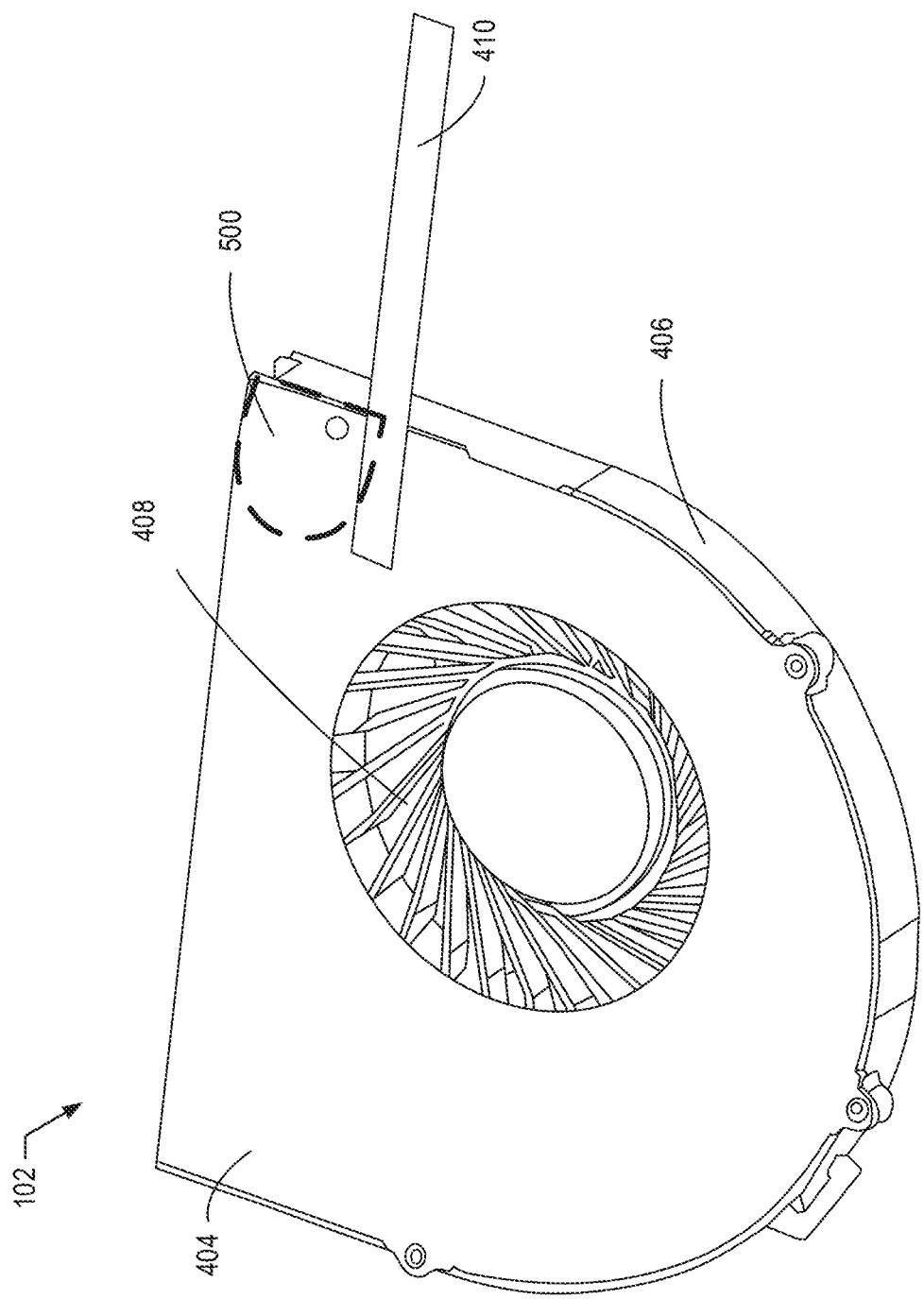
FIG. 5A is a top, perspective view of an example fan of the electronic device of FIG. 1 showing a position of an alternative example sound transducer.
Figure 5B:
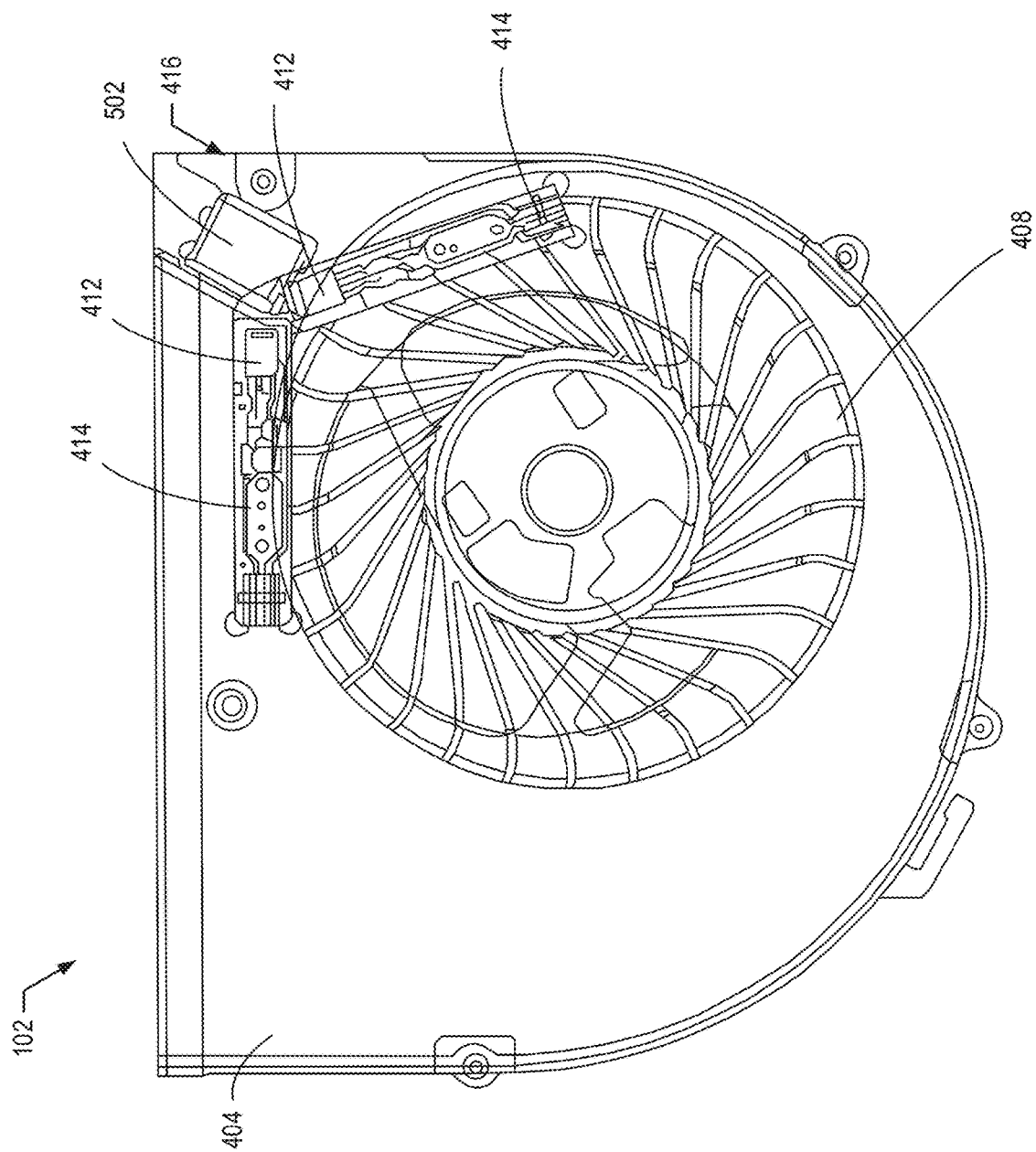
FIG. 5B is a top view of the fan of FIG. 4A with a top plate removed and showing a position of two example microphones.
Figure 5C:
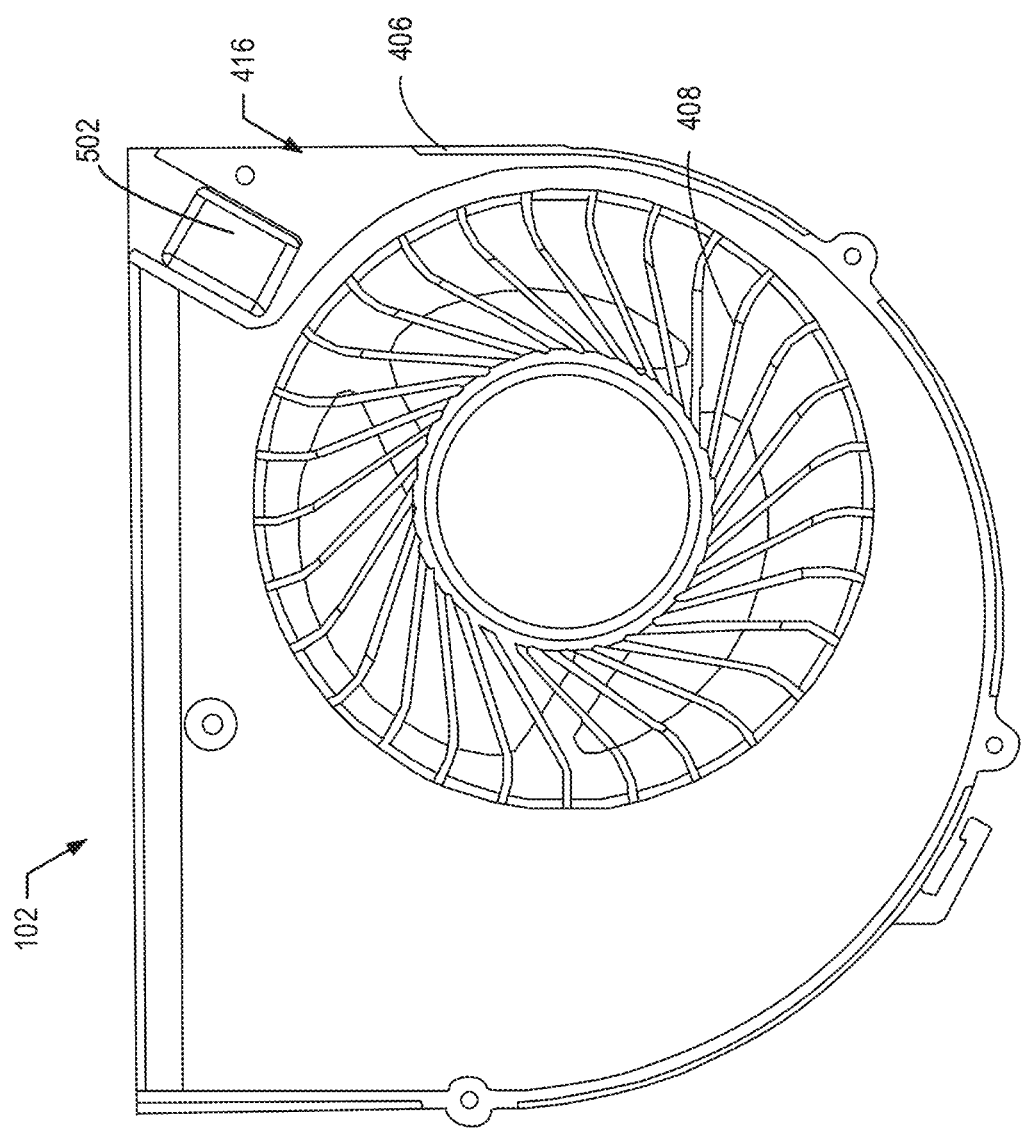
FIG. 5C is a top view of the fan of FIG. 5A with the top plate removed and showing an alternative example sound transducer.
Figure 5D:
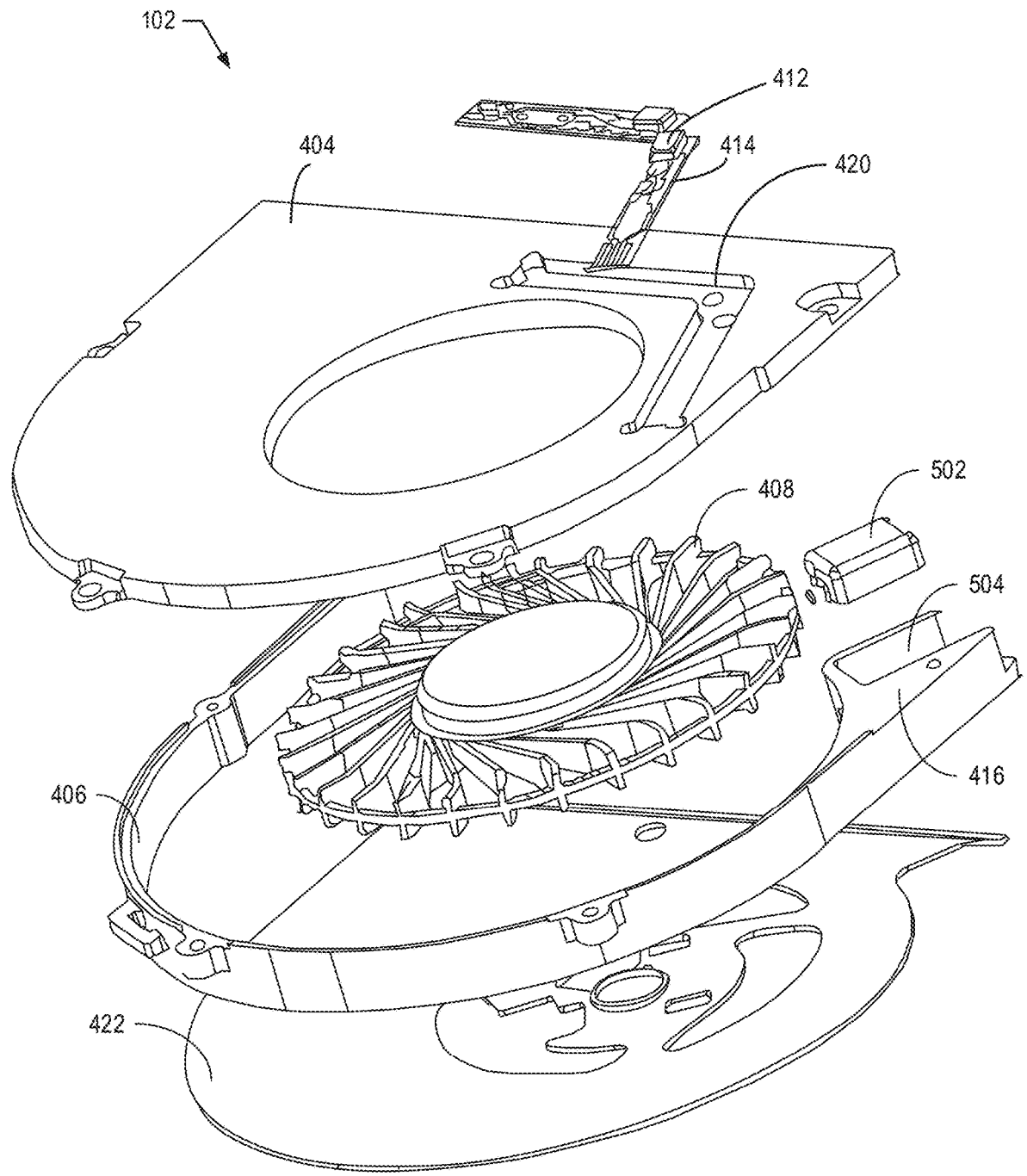
FIG. 5D is an exploded view of the fan of FIG. 5A.

FIG. 5A is a top, perspective view of the fan 102 of the electronic device 100 of FIG. 1 showing a position 500 of an alternative example sound transducer 502. FIG. 5B is a top view of the fan 102 of FIG. 4A with the top plate 404 removed and showing the position of the two example fan microphones 412 relative to the sound transducer 502. FIG. 5C is a top view of the fan 102 of FIG. 5A with the top plate 404 removed and showing the alternative sound transducer 502. In this example, the sound transducer 502 is a balanced armature. The balanced armature 502 has a miniaturized size and is easily integrated into the fan 102 without increasing the size of the fan 102.

The balanced armature 502 is positioned in the cutwater region 416 in the example of FIGS. 5A-E. FIG. 5E is an exploded view of the fan 102 of FIG. 5A and shows a recess 504 in the fan housing 406 to hold the balanced armature 502. In other examples, the balanced armature 502 may be located in a different position in the fan 102 or adjacent to and/or external to the fan 102. The examples disclosed herein include sound transducers such as, for example, a dynamic speaker and/or a balanced armature. In other examples other sounds transducers may alternatively or additionally be used such a, for example, or other types of sound transducers that are powerful enough for to deduct or reshape noise at the cutwater region.

Figure 6:
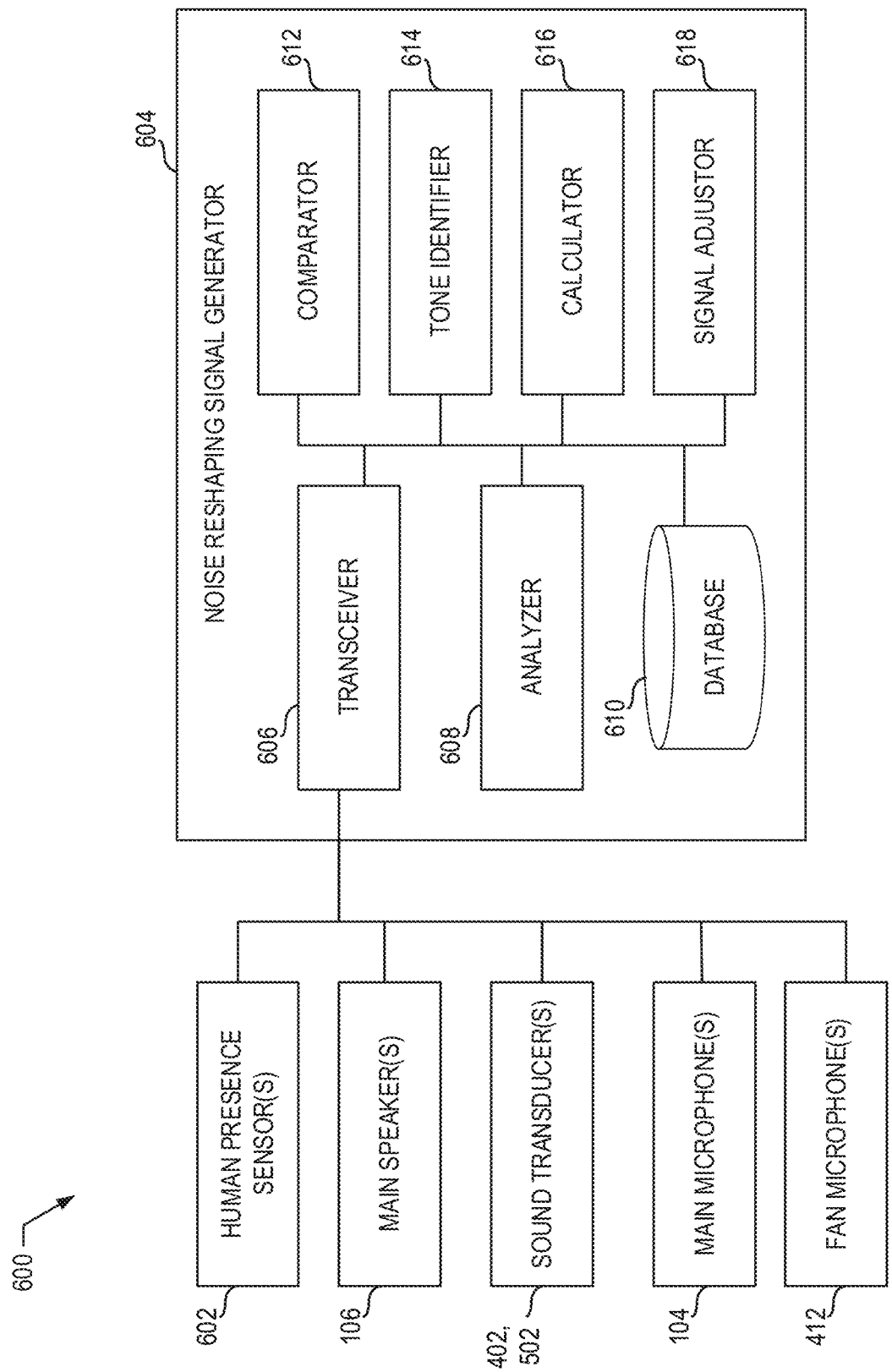
FIG. 6 is a block diagram of an example system to reshape fan noise of an electronic device in accordance with the teachings of this disclosure.

FIG. 6 is a block diagram of an example system 600 to reshape fan noise of an electronic device in accordance with the teachings of this disclosure. The example system 600 may be incorporated into the electronic device 100. The example system includes one or more example human presence sensor(s) 602, one or more of the main speaker(s) 106, one or more of the sound transducer(s) 402, 502, one or more of the main microphone(s) 104, one or more of the fan microphone(s) 412, and an example noise reshaping signal generator 604. The noise reshaping signal generator 604 includes an example transceiver 606, an example analyzer 608, an example database 610, an example comparator 612, an example tone identifier 614, an example calculator 616, and an example signal adjustor 618.

The human presence sensor 602 detects if a human is present at the electronic device 100. The human presence sensor 602 generates a signal and/or data indicative of a presence or an absence of a human. If a human is not present, the noise reshaping signal generator 604 does not operate to reshape fan noise because there is no human present to be irritated by the fan noise. In some examples, the human presence sensor 602 detects an open or closed position of a lid of the electronic device 100. In such examples, a presence of a human may be assumed based on an open position of the lid. In some examples, the human presence sensor 602 includes a user facing camera that detects whether a person is within a field of view of the camera. In some examples, the human presence sensor 602 includes a camera next to the user facing camera. In some examples, the human presence sensor 602 includes a low-resolution camera. In some examples, the human presence sensor 602 includes a clock to track time. The human presence sensor 602 may indicate that a human is not present after a threshold amount of time that the human presence sensor 602 no longer detects the presence of the human. The noise reshaping signal generator 604 receives the signal and/or data from the human presence sensor 602 via the transceiver 606.

The main speaker 106 also is communicatively coupled to the noise reshaping signal generator 604 via the transceiver 606. The analyzer 608 determines if the main speaker 106 is in use. For example, the analyzer 608 determines if the main speaker 106 is outputting audio content to the user. If the main speaker 106 is outputting audio content to the user, the noise reshaping signal generator 604 does not operate to reshape fan noise because the fan noise is obscured or likely obscured by the audio content emanating from the main speaker 106. In this mode of operation, the fan noise is likely not irritating to the user.

When the noise reshaping signal generator 604 operates to reshape fan noise, fan microphone 412 gathers acoustic signals that include fan noise from the fan 102 and communicates the signals to the noise reshaping signal generator 604 via the transceiver 606. In some examples, the main microphone 104 also gathers acoustic signals that may include the fan noise. In such examples, the main microphone 104 communicates the signals to the noise reshaping signal generator 604 via the transceiver 606.

For the noise reshaping operation, the analyzer 608 determines the workload input of the electronic device 100. For example, the analyzer 608 determines or accesses the central processing unit (CPU) power level. In some examples, the analyzer 608 accesses a basic input/output system (BIOS) table or other data structure that correlates fan noise with pulse width modulation (PWM) measurements. This data or table is generated by pre-calibration for rough noise level versus PWM setting (fan speed setting). This table gives a rough noise level to expect with the electronic device 100. An example table includes:

| PWM setting (duty cycle) | Fan Speed (RPM) | Estimated Noise Level (dBA) |
|---|---|---|
| 100% | 1500 | 48 |
| 50% | 800 | 42 |
| 20% | 400 | 36 |

The CPU power level is dynamically based on the workload. A higher power level translates to higher fan speed and more noise. With this information, the analyzer 608 estimates baseline fan noise. The analyzer 608 also determines background or environmental noise based on the signals received from the main microphone 104 and/or fan microphone 412.

The comparator 612 compares the estimated environmental noise and the baseline fan noise. The analyzer 608 determines if there may be system problems or anomalies based on the comparison. In other examples, the analyzer 608 identifies noise signals for reshaping based on the comparison. For example, fan noise that exceeds environmental noise may be candidate noise signals for reshaping.

The tone identifier 614 identifies high pitch tones in the fan noise. Example tones that are high pitched relative to the signal are shown in FIG. 2. The high pitch tones are candidate noise signals for reshaping. Thus, in some examples all fan noise is to be reshaped. In some examples fan noise that exceed environmental noise is to be reshaped. In some examples, high pitch tones are to be reshaped. As disclosed above, these examples may also be applied to low pitch tones.

The calculator 616 determines a gain to add to the fan noise signal to reshape the signal and blend the noise to mitigate the irritation caused by the noise. The signal with the gain determined by the calculator 616 is to be produced by the sound transducer 402, 502. In some examples, this signal is a function of the fast Fourier transform (FFT) of the signals gathered from the fan microphone 412 (and/or the main microphone 104) and the target noise response. In some examples, the target noise response is pink noise or white noise. In some examples, the calculator 616 computes the gain (amplitude) as a product of the original amplitude and a function of the BIOS table data, system power, and FFT of the signals gathered from the fan microphone 412 (and/or the main microphone 104).

In some examples, the analyzer 608 identifies critical bands around a high pitch tone. The calculator 616 computes the prominence ratio (PR). The PR is a parameter that indicates if a tone is prominent. That is, the PR indicates a relative level of a tone compared to surrounding tones. This parameter is used for determining or judging when a tone such as, for example, a mid-frequency tone or a high frequency tone (e.g., great than 1000 Hz) that is emitted by a machine (e.g., the fan 102 of the electronic device 100) could become annoying to the user. In some examples, the PR is determined based on Equation 1.

$$PR = 10\left(\log\frac{B}{\frac{(A+C)}{2}}\right) dB \quad \text{Equation 1}$$

where A and C are the critical bands that surround the identified tone, B. In other words, the prominence ratio is decibel difference of the tone critical band level (B) and the averaged adjacent critical bands (A and C).

The comparator 612 compares the PR to a threshold level. If the PR exceeds the threshold or does not satisfy the threshold, the identified tone is likely annoying to the user. In some examples, the threshold is 9 dB. Thus, for example, if the band containing the problematic tone (B) has a level 9 dB more than the adjacent bands (A and C), then the tone becomes discomforting the user.

If the PR is less than the threshold decibel level, the analyzer 608 may determine that no reshaping of the fan noise is needed. If the PR is greater than the threshold, the calculator 616 determines a gain for at least one of the critical bands so that the PR would be less than the threshold. In some examples, the analyzer 608 adjusts the gains based on a location of the fan 102 and/or a location of the sound transducer 402, 502. For example, the gain may be adjusted based on a relative position between two or more of the fan 102, the sound transducer 402, 502, and/or the fan microphone 412 (and/or main microphone 104).

In some examples, the analyzer 608 considers acceptable noise thresholds. An acceptable noise threshold is a level of noise that is acceptable or not irritating to a user. In some examples, the acceptable noise threshold is based on a net gain of the acoustic signal based on the relative locations, operating capabilities, and operating status of one or more of the fan 102, the microphones 104, the speakers 106, the fan microphone 412, the sound transducers 402, 502, and/or other components of the electronic device 102. The analyzer 608 can adjust the gain or masking noise or energy based on the acceptable noise threshold. Thus, in some examples, the system 600 to reshape fan noise of the electronic device 100 can optimize performance of the electronic device 100 based on noise thresholds that are acceptable to the user. For example, if there is a higher acceptable noise threshold, the electronic device 100 may be able to operate with higher performance.

The signal adjustor 618 generates a signal or instructions for the gain or masking noise or energy to be produced to reshape the fan noise. The noise reshaping signal generator 604 sends a signal or instructions of the gain or masking noise or energy via the transceiver 606 to the sound transducer 402, 502. The sound transducer 402, 502 generates an acoustic signal including the gain to reshape the fan noise. In some examples, the main speaker 106 is used in addition to or alternative to the sound transducer 402, 502 to create the acoustic signal that reshapes the noise. When using both the sound transducer 402, 502 and the main speaker 106, the noise reshaping signal generator 604 can achieve the fine tuning of different levels by using one set of speakers (e.g., the sound transducers 402, 502 on or near the fan 102) or the other set of speakers (e.g., the main speakers 106 in system chassis), or both sets.

Thus, the example system 600 uses the fan microphones 412 and/or main microphone 104 and the sounds transducer 402, 502 and/or main speakers 106 to generate purposely shaped audio waveform to blend into the existing fan noise. The resulting audio signal is a less annoying noise for better human perception. Because the noise can be reshaped, the examples disclosed herein allow for more fan noise, which allows higher performance of the electronic device 100.

Figure 7:
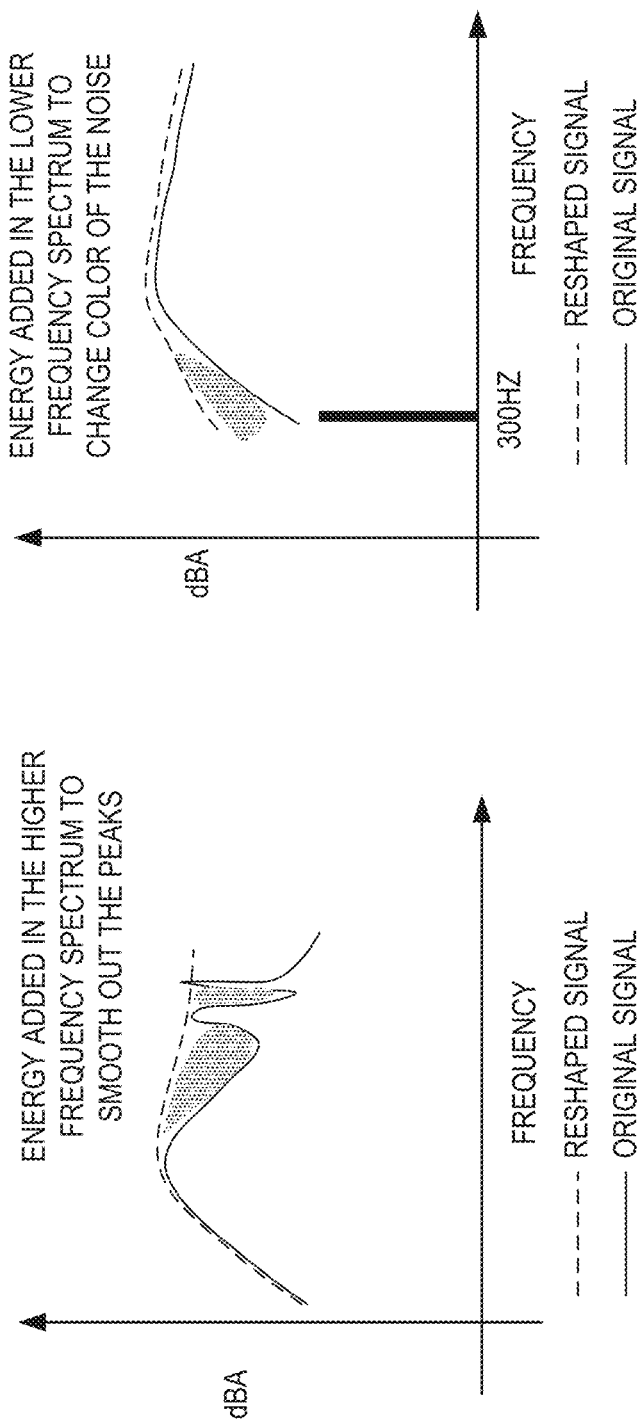
FIG. 7A is a plot showing example energy added to an example acoustic signal to smooth high tones.
FIG. 7B is a plot showing example energy added to an example acoustic signal to change a color of noise.

FIG. 7A is a plot showing example energy added to an example acoustic signal to smooth high tones. FIG. 7B is a plot showing example energy added to an example acoustic signal to change a color of noise. As shown in these examples, the energy added by the sound transducer 402, 502 blends or spreads out the high pitch tone. FIG. 7A shows fan noise, the high pitch tones (around 1000 Hz) are annoying noise for human perception. In these examples, the system 600 including the main microphones 104 and/or the fan microphones 412 detect the fan noise. The analyzer 608 employs the algorithms disclosed herein to identify the high pitch noise of interest, and the calculator 616 determines the signal needed to blend this high pitch signal to flatten it out. The sound transducer 402, 502 and/or main speakers 106 output the signal and may include additional frequency signals or to push the color of noise (FIG. 7B) toward pink noise for better human perception.

In some examples, one predominant frequency that is greater than 1000 Hz in the fan noise spectrum is the blade passing frequency (BPF). The BPF is a product of the number of blades of the fan and revolutions per sec. The examples disclosed herein can track the BPF from the speed of the fan 102 and identify the critical bands A and C, then raise level of the critical bands to an optimal level so that the PR is less than 9 dB.

In the illustrated example of FIG. 6, the system 600 includes means for processing an acoustic signal. In this example, the processing means is implemented by any processor structured to perform the corresponding operation by executing software or firmware, or hardware circuit (e.g., discrete and/or integrated analog and/or digital circuitry, an FPGA, a PLD, a FPLD, an ASIC, a comparator, an operational-amplifier (op-amp), a logic circuit, etc.) structured to perform the corresponding operation without executing software or firmware, but other structures are likewise appropriate. In some examples, the noise reshaping signal generator 604 implements the processing means.

While an example manner of implementing the noise reshaping signal generator 604 is illustrated in FIG. 6, one or more of the elements, processes and/or devices illustrated in FIG. 6 may be combined, divided, re-arranged, omitted, eliminated and/or implemented in any other way. Further, the example human presence sensor(s) 602, the example transceiver 606, the examiner analyzer 608, the example comparator 612, the example tone identifier 614, the example calculator 616, the example signal adjustor 618, and/or, more generally, the example noise reshaping signal generator 604 of FIG. 6 may be implemented by hardware, software, firmware and/or any combination of hardware, software and/or firmware. Thus, for example, any of the example human presence sensor(s) 602, the example transceiver 606, the examiner analyzer 608, the example comparator 612, the example tone identifier 614, the example calculator 616, the example signal adjustor 618, and/or, more generally, the example noise reshaping signal generator 604 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example human presence sensor(s) 602, the example transceiver 606, the examiner analyzer 608, the example comparator 612, the example tone identifier 614, the example calculator 616, the example signal adjustor 618, and/or the example noise reshaping signal generator 604 is/are hereby expressly defined to include a non-transitory computer readable storage device or storage disk such as a memory, a digital versatile disk (DVD), a compact disk (CD), a Blu-ray disk, etc. including the software and/or firmware. Further still, the example noise reshaping signal generator 604 of FIG. 6 may include one or more elements, processes and/or devices in addition to, or instead of, those illustrated in FIG. 6, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 8:
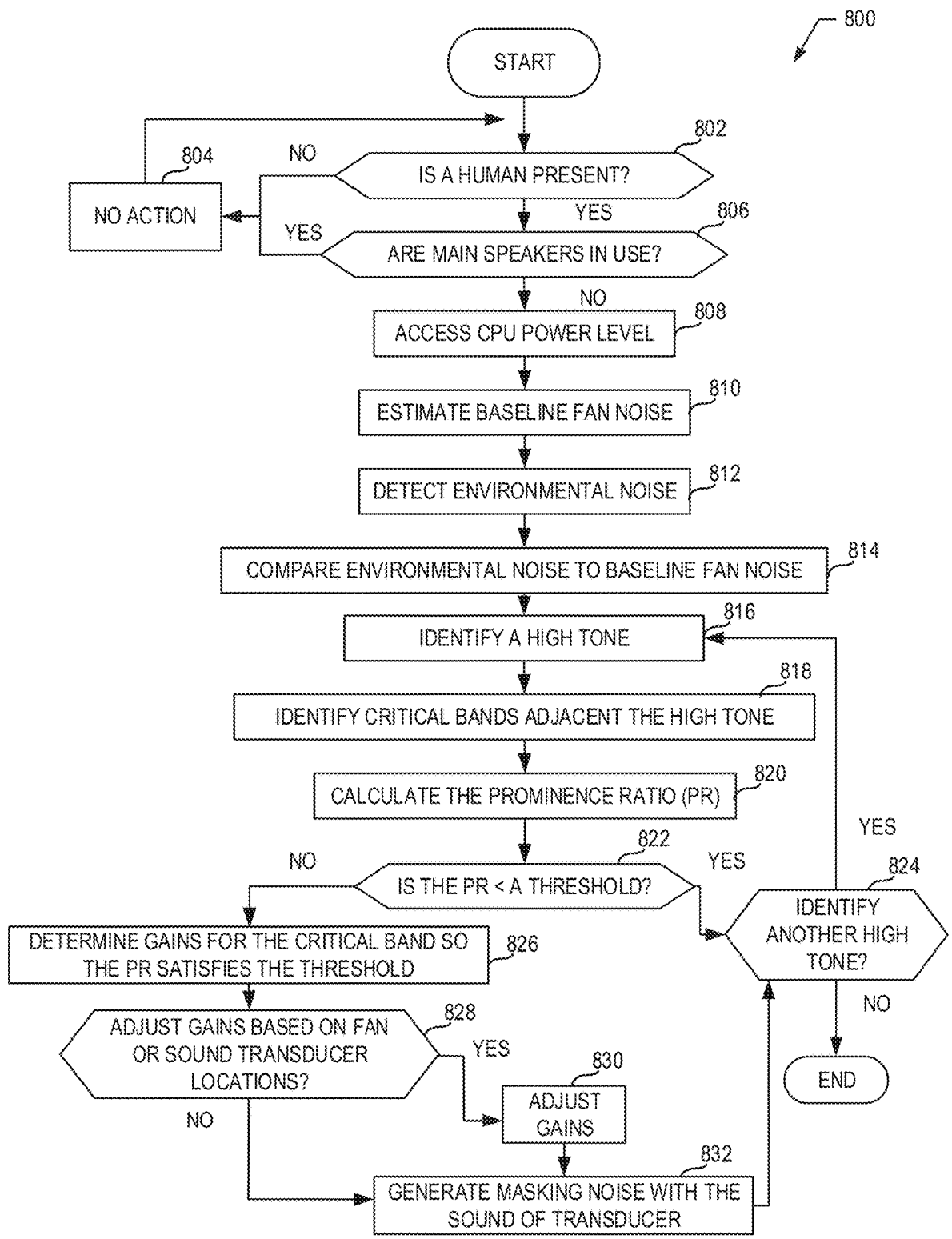
FIG. 8 is a flowchart representative of machine readable instructions which may be executed to implement the example noise reshaping generator and system of FIG. 6.

A flowchart representative of example hardware logic, machine readable instructions, hardware implemented state machines, and/or any combination thereof for implementing the system 600 of FIG. 6 is shown in FIG. 8. The machine readable instructions may be one or more executable programs or portion(s) of an executable program for execution by a computer processor and/or processor circuitry, such as the processor 912 shown in the example processor platform 900 discussed below in connection with FIG. 9. The program may be embodied in software stored on a non-transitory computer readable storage medium such as a CD-ROM, a floppy disk, a hard drive, a DVD, a Blu-ray disk, or a memory associated with the processor 912, but the entire program and/or parts thereof could alternatively be executed by a device other than the processor 912 and/or embodied in firmware or dedicated hardware. Further, although the example program is described with reference to the flowchart illustrated in FIG. 8, many other methods of implementing the example system 600 and/or the noise reshaping signal generator 604 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more devices (e.g., a multi-core processor in a single machine, multiple processors distributed across a server rack, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement one or more functions that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIG. 8 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

The program 800 of FIG. 8 includes the human presence sensor 602 detecting if a human is present before the electronic device 100 (block 802). A human present at the electronic device 100 indicates that the example system 600 of FIG. 6 may be implemented to reshape fan noise to enhance the experience of the user by masking irritating fan noise. In some examples, the analyzer 608 determines if a human is present based on data provided to or gathered by the noise reshaping signal generator 604. If a human is not present, the noise reshaping signal generator 604 and the system 600 in general take no action (block 804) with respect to reshaping fan noise.

If a human is present (block 802), the analyzer 608 determines if one or more of the main speakers 106 of the electronic device 100 are in use (block 806). If one or more of the main speakers 106 are in use, the user of the electronic device 100 is likely consuming audio media and the fan noise would be obscured. If the main speakers 106 are in use, the noise reshaping signal generator 604 and the system 600 in general take no action (block 804) with respect to reshaping fan noise.

If the main speakers 106 are not in use, the analyzer 608 accesses the workload, operating power level, or CPU power level of the electronic device 100 (block 808). The analyzer 608 estimates baseline fan noise (block 810) based on the workload or operating power level of the electronic device 100.

The fan microphone 412 detects environmental noise (block 812). For example, the fan microphone 412 detects the background noise at the fan 102. In some examples, the main microphone 104 supplements the data gathered from the fan microphone 412. In other examples, the main microphone 104 is used in place of the fan microphone 412.

The comparator 612 compares the environmental noise to the baseline fan noise (block 814). The tone identifier 614 identifies high pitch tones (block 816). In some examples, the tone identifier 614 identifies high pitch tones in the fan noise signal. In some examples, the tone identifier 614 identifies high pitch tones in the comparison of the fan noise with the environmental or background noise.

The analyzer 608 identifies critical bands around the identified high pitch tone (block 818). The calculator 616 calculates the prominence ratio (PR) based on the identified high pitch tone and critical bands (block 820). In some examples, the calculator 616 uses Equation 1 to determine the PR.

The comparator 612 compares the PR to a threshold (block 822). If the PR is below or otherwise does not meet the threshold, the analyzer 608 may determine that the fan noise signal is not be reshaped. The example process 800 continues with the analyzer 608 determining if another high pitch tone is to be identified (block 824). If another high pitch tone is to be identified, the tone identifier identifies another high pitch tone (block 816), and the process 800 proceeds as disclosed above. If the analyzer 608 determines that another tone is not to be identified, the process 800 ends.

If the PR is above or otherwise satisfies the threshold (block 822), the calculator determines a gain for at least one of the critical bands so that the PR would be less than the threshold (block 826). In some examples, the analyzer 608 determines if the gains are to be adjusted based on a fan location and/or a sound transducer location (block 828). The gains are to be adjusted, the analyzer 608 adjusts the gains based on a location of the fan 102 and/or a location of the sound transducer 402, 502 (block 830).

If the analyzer 608 determines that the gains are not to be adjusted (block 828) or after the gains are adjusted (block 830), the signal adjustor 618 generates a signal or instructions for the gain or masking noise or energy to be produced to reshape the fan noise. The sound transducer 402, 502 generates the masking noise, which is an acoustic signal including the gain, to reshape the fan noise (block 832).

The example process 800 continues with the analyzer 608 determining if another high pitch tone is to be identified (block 824). If another high pitch tone is to be identified, the tone identifier identifies another high pitch tone (block 816), and the process 800 proceeds as disclosed above. If the analyzer 608 determines that another tone is not to be identified, the process 800 ends.

Figure 9:
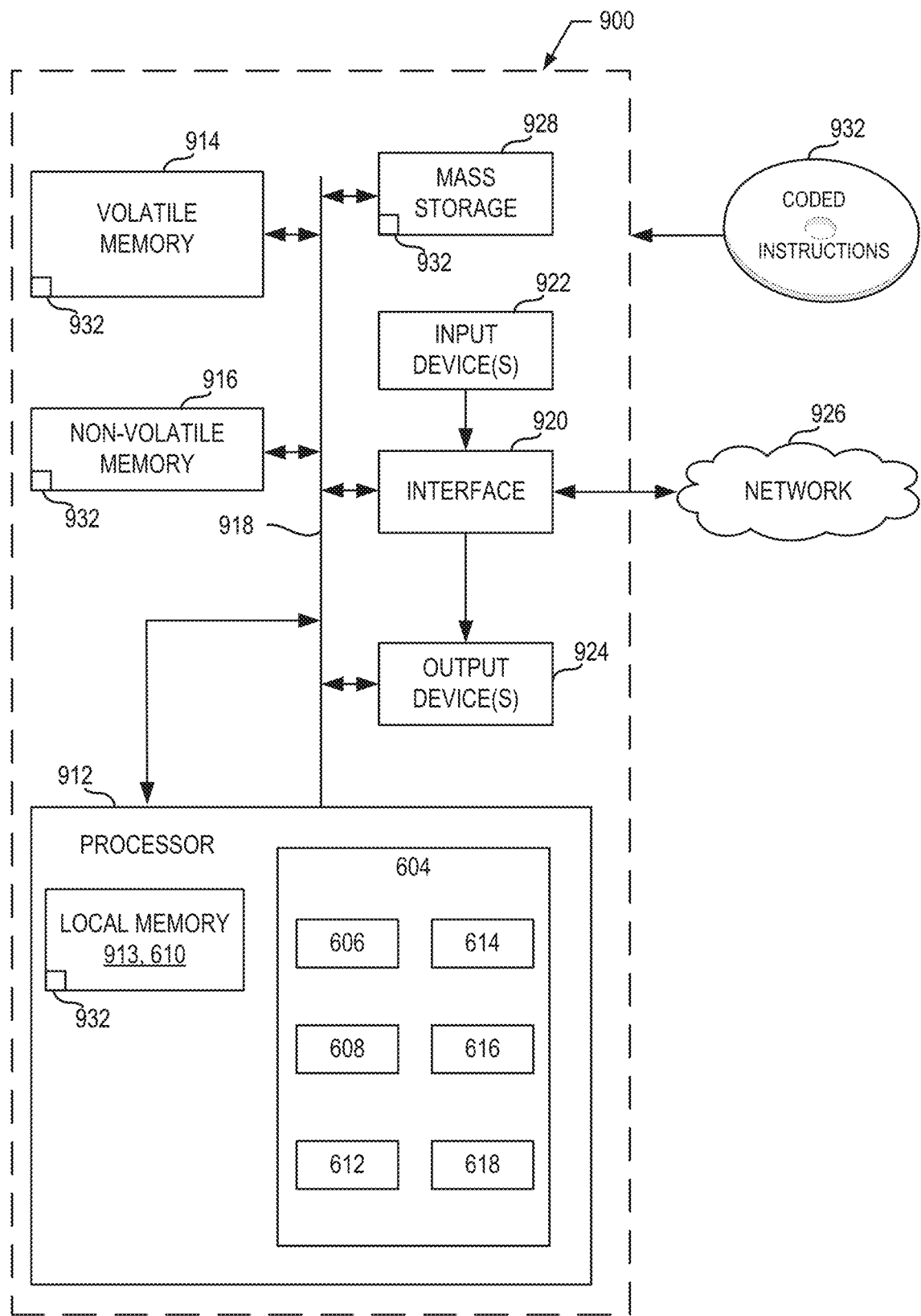
FIG. 9 is a block diagram of an example processing platform structured to execute the instructions of FIG. 8 to implement the example noise reshaping generator and system of FIG. 6.

FIG. 9 is a block diagram of an example processor platform 900 structured to execute the instructions of FIG. 8 to implement the system of FIG. 6. The processor platform 900 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 900 of the illustrated example includes a processor 112. The processor 912 of the illustrated example is hardware. For example, the processor 912 can be implemented by one or more integrated circuits, logic circuits, microprocessors, GPUs, DSPs, or controllers from any desired family or manufacturer. The hardware processor may be a semiconductor based (e.g., silicon based) device. In this example, the processor 912 implements the noise reshaping signal generator 604, the transceiver 606, the analyzer 608, the comparator 612, the tone identifier 614, the calculator 616, and the signal adjustor 618.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), a Bluetooth® interface, a near field communication (NFC) interface, and/or a PCI express interface.

In the illustrated example, one or more input devices 922 are connected to the interface circuit 920. The input device(s) 922 permit(s) a user to enter data and/or commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 920 of the illustrated example, thus, typically includes a graphics driver card, a graphics driver chip and/or a graphics driver processor.

The interface circuit 920 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 926. The communication can be via, for example, an Ethernet connection, a digital subscriber line (DSL) connection, a telephone line connection, a coaxial cable system, a satellite system, a line-of-site wireless system, a cellular telephone system, etc.

The processor platform 900 of the illustrated example also includes one or more mass storage devices 928 for storing software and/or data. Examples of such mass storage devices 1028 include floppy disk drives, hard drive disks, compact disk drives, Blu-ray disk drives, redundant array of independent disks (RAID) systems, and digital versatile disk (DVD) drives.

The machine executable instructions 932 of FIG. 8 may be stored in the mass storage device 928, in the volatile memory 914, in the non-volatile memory 916, and/or on a removable non-transitory computer readable storage medium such as a CD or DVD.

From the foregoing, it will be appreciated that example systems, apparatus, articles of manufacture, and methods have been disclosed that abate, cancel, reduce, reshape or otherwise mask acoustic noise produced by fans in electronic devices. These examples control the noise characteristics of the fans for improved human perception. The example fan hardware designs disclosed herein cancel the noise at the fan source. The examples disclosed herein enable the noise to be reshaped and abated without using thicker designs with larger blower. These examples disclosed herein also do not require a redesign of the cooling fans themselves. The examples disclosed herein also do not cap workload or power level performance of the electronic device 100. Because the fan noise is controlled, the examples disclosed herein enable electronic devices to operate at a higher power with increased fan operation and noise without causing discomfort to the human users. Thus, the control of the noise characteristics using the examples disclosed herein improve operation of computing devices by enabling higher system performance with improved thermal control.

Typically fan performance is limited by its noise, for example a fan could deliver up to 10 cubic feet per minute (CFM) open air flowrate, but the noise level at this fan speed could reach 50 dB, which is much higher than most of the original equipment manufacturer specifications (which range from about 40 dB to about 45 dB). In the examples disclosed herein, the fan noise can be reduced by several decibels, which is enough for the fan to perform and operate unrestrained. These examples also increase the system on chip power and system performance. Reducing the noise by several decibels at its maximum fan speed is beneficial for customers because the electronic device can be made more powerful or thinner and lighter without conceding to system noise.

Example 1 includes a system to reshape fan noise of a fan of an electronic device. The system includes a microphone to detect a first acoustic signal including fan noise. The system also includes a processor to: identify a tone in the first acoustic signal; and determine a gain to add to the first acoustic signal to mask the tone. The system also includes a sound transducer to present a second acoustic signal including the gain.

Example 2 includes the system of Example 1, and optionally includes the microphone being coupled to a housing of the fan in an interior of the electronic device.

Example 3 includes the system of any of Examples 1-2, and optionally includes the microphone being positioned at or near a cutwater region of the fan.

Example 4 includes the system of any of Examples 1-3, and optionally includes the microphone being a first microphone and the system including a second microphone to detect the first acoustic signal.

Example 5 includes the system of any of Examples 1-4, and optionally includes the sound transducer being coupled to a housing of the fan in an interior of the electronic device.

Example 6 includes the system of any of Examples 1-5, and optionally includes the sound transducer being a dynamic speaker.

Example 7 includes the system of any of Examples 1-6, and optionally includes the sound transducer being a balanced armature.

Example 8 includes the system of any of Examples 1-7, and optionally includes the processor is to: identify a critical band adjacent the tone; calculate a prominence ratio for the tone; and determine the gain based on the prominence ratio.

Example 9 includes the system of any of Examples 1-8, and optionally includes the processor is to: identify a first critical band adjacent the tone; identify a second critical band adjacent the tone; calculate a prominence ratio for the tone based on the first critical band and the second critical band; compare the prominence ratio to a threshold; and determine the gain to add when the prominence ratio does not satisfy the threshold, the gain including a first gain for the second acoustic signal in the first critical band and a second gain for the second acoustic signal in the second critical band.

Example 10 includes the system of any of Examples 1-9, and optionally includes the gain being adjusted based on a location of at least one of the fan, the microphone, or the sound transducer.

Example 11 includes the system of any of Examples 1-10, and optionally includes the gain being adjusted based on a relative positioning among the fan, the microphone, and the sound transducer.

Example 12 includes the system of any of Examples 1-11, and optionally includes the gain being adjusted to change a color of the noise.

Example 13 includes the system of any of Examples 1-12, and optionally includes the processor is to: access data indicative of a presence of a human near the electronic device; and identify the tone based on the presence.

Example 14 includes the system of any of Examples 1-13, and optionally includes the processor is to: access data indicative of when a speaker of the electronic device is in use, the speaker positioned to provide audio content to a user of the electronic device; and identify the tone based when the speaker is not in use.

Example 15 includes a system to reshape fan noise of a fan of an electronic device. The system includes means for detecting a first acoustic signal including fan noise. The system includes means for processing the acoustic signal, the processing means to: identify a tone in the acoustic signal; and determine a gain to add to the acoustic signal to mask the tone. The system also includes means for generating a second acoustic signal including the gain.

Example 16 includes the system of Example 15, and optionally includes the detecting means being coupled to a housing of the fan in an interior of the electronic device.

Example 17 includes the system of any of Examples 15-16, and optionally includes the detecting means being positioned at or near a cutwater region of the fan.

Example 18 includes the system of any of Examples 15-17, and optionally includes the detecting means including two microphones to detect the first acoustic signal.

Example 19 includes the system of any of Examples 15-18, and optionally includes the generating means being coupled to a housing of the fan in an interior of the electronic device.

Example 20 includes the system of any of Examples 15-19, and optionally includes the generating means including a dynamic speaker.

Example 21 includes the system of any of Examples 15-20, and optionally includes the generating means including a balanced armature.

Example 22 includes the system of any of Examples 15-21, and optionally includes the processing means is to: identify a critical band adjacent the tone; calculate a prominence ratio for the tone; and determine the gain based on the prominence ratio.

Example 23 includes the system of any of Examples 15-22, and optionally includes the processing means is to: identify a first critical band adjacent the tone; identify a second critical band adjacent the tone; calculate a prominence ratio for the tone based on the first critical band and the second critical band; compare the prominence ratio to a threshold; and determine the gain to add when the prominence ratio does not satisfy the threshold, the gain including a first gain for the second acoustic signal in the first critical band and a second gain for the second acoustic signal in the second critical band.

Example 24 includes the system of any of Examples 15-23, and optionally includes the gain being adjusted based on a location of at least one of the fan, the detecting means, or the generating means.

Example 25 includes the system of any of Examples 15-24, and optionally includes the gain being adjusted based on a relative positioning among the fan, the detecting means, and the generating means.

Example 26 includes the system of any of Examples 15-25, and optionally includes the gain being adjusted to change a color of the noise.

Example 27 includes the system of any of Examples 15-26, and optionally includes the processing means is to: access data indicative of a presence of a human near the electronic device; and identify the tone based on the presence.

Example 28 includes the system of any of Examples 15-27, and optionally includes the processing means is to: access data indicative of when a speaker of the electronic device is in use, the speaker positioned to provide audio content to a user of the electronic device; and identify the tone based when the speaker is not in use.

Example 29 includes an apparatus to reshape fan noise of a fan of an electronic device. The apparatus includes a memory and processor circuitry to execute instructions to: identify a tone in a detected first acoustic signal; determine a gain to add to the first acoustic signal to mask the tone; and cause a sound transducer to generate a second acoustic signal including the gain.

Example 30 includes the apparatus of Example 29, and optionally includes the processor circuitry to: identify a critical band adjacent the tone; calculate a prominence ratio for the tone; and determine the gain based on the prominence ratio.

Example 31 includes the apparatus of any of Examples 29-30, and optionally includes the processor circuitry to: identify a first critical band adjacent the tone; identify a second critical band adjacent the tone; calculate a prominence ratio for the tone based on the first critical band and the second critical band; compare the prominence ratio to a threshold; and determine the gain to add when the prominence ratio does not satisfy the threshold, the gain including a first gain for the second acoustic signal in the first critical band and a second gain for the second acoustic signal in the second critical band.

Example 32 includes the apparatus of any of Examples 29-31, and optionally includes the processor circuitry to adjust the gain based on a location of at least one of the fan, a microphone that detects the first acoustic signal, or the sound transducer.

Example 33 includes the apparatus of any of Examples 29-32, and optionally includes the processor circuitry to adjust the gain based on a relative positioning among the fan, a microphone that detects the first acoustic signal, and the sound transducer.

Example 34 includes the apparatus of any of Examples 29-33, and optionally includes the processor circuitry to adjust the gain to change a color of the noise.

Example 35 includes the apparatus of any of Examples 29-34, and optionally includes the processor circuitry to: access data indicative of a presence of a human near the electronic device; and identify the tone based on the presence.

Example 36 includes the apparatus of any of Examples 29-35, and optionally includes the processor circuitry to: access data indicative of when a speaker of the electronic device is in use, the speaker positioned to provide audio content to a user of the electronic device; and identify the tone based when the speaker is not in use.

Example 37 includes a non-transitory computer readable storage medium comprising instructions which, when executed, cause one or more processors to at least: identify a tone in a detected first acoustic signal; determine a gain to add to the first acoustic signal to mask the tone; and cause a sound transducer to generate a second acoustic signal including the gain.

Example 38 includes the medium of Example 37, and optionally includes the instructions causing the one or more processors to: identify a critical band adjacent the tone; calculate a prominence ratio for the tone; and determine the gain based on the prominence ratio.

Example 39 includes the medium of any of Examples 37-38, and optionally includes the instructions causing the one or processors to identify a first critical band adjacent the tone; identify a second critical band adjacent the tone; calculate a prominence ratio for the tone based on the first critical band and the second critical band; compare the prominence ratio to a threshold; and determine the gain to add when the prominence ratio does not satisfy the threshold, the gain including a first gain for the second acoustic signal in the first critical band and a second gain for the second acoustic signal in the second critical band.

Example 40 includes the medium of any of Examples 37-39, and optionally includes the instructions causing the one or more processors to adjust the gain based on a location of at least one of the fan, a microphone that detects the first acoustic signal, or the sound transducer.

Example 41 includes the medium of any of Examples 37-40, and optionally includes the instructions causing the one or more processors to adjust the gain based on a relative positioning among the fan, a microphone that detects the first acoustic signal, and the sound transducer.

Example 42 includes the medium of any of Examples 37-41, and optionally includes the instructions causing the one or more processors to adjust the gain to change a color of the noise.

Example 43 includes the medium of any of Examples 37-42, and optionally includes the instructions causing the one or more processors to: access data indicative of a presence of a human near the electronic device; and identify the tone based on the presence.

Example 44 includes the medium of any of Examples 37-43, and optionally includes the instructions causing the one or more processors to: access data indicative of when a speaker of the electronic device is in use, the speaker positioned to provide audio content to a user of the electronic device; and identify the tone based when the speaker is not in use.

Example 45 includes a method of reshaping fan noise of a fan of an electronic device. The method includes identifying, by executing instructions with a processor, a tone in a first acoustic signal, the first acoustic signal including fan noise; determining, by executing an instruction with the processor, a gain to add to the first acoustic signal to mask the tone; and generating a second acoustic signal including the gain.

Example 46 include the method of Example 45, and optionally includes identifying, by executing an instruction with the processor, a critical band adjacent the tone; calculating, by executing an instruction with the processor, a prominence ratio for the tone; and determining, by executing an instruction with the processor, the gain based on the prominence ratio.

Example 47 includes the method of any of Examples 45-46, and optionally includes identifying, by executing an instruction with the processor, a first critical band adjacent the tone; identifying, by executing an instruction with the processor, a second critical band adjacent the tone; calculating, by executing an instruction with the processor, a prominence ratio for the tone based on the first critical band and the second critical band; comparing, by executing an instruction with the processor, the prominence ratio to a threshold; and determining, by executing an instruction with the processor, the gain to add when the prominence ratio does not satisfy the threshold, the gain including a first gain for the second acoustic signal in the first critical band and a second gain for the second acoustic signal in the second critical band.

Example 48 includes the method of any of Examples 45-47, and optionally includes adjusting, by executing an instruction with the processor, the gain based on a location of at least one of the fan, a microphone that detects the first acoustic signal, or the sound transducer.

Example 49 includes the method of any of Examples 45-48, and optionally includes adjusting, by executing an instruction with the processor, the gain based on a relative positioning among the fan, a microphone that detects the first acoustic signal, and the sound transducer.

Example 50 includes the method of any of Examples 45-49, and optionally includes adjusting, by executing an instruction with the processor, the gain to change a color of the noise.

Example 51 includes the method of any of Examples 45-50, and optionally includes accessing data indicative of a presence of a human near the electronic device; and identifying, by executing an instruction with the processor, the tone based on the presence.

Example 52 includes the method of any of Examples 45-51, and optionally includes accessing data indicative of when a speaker of the electronic device is in use, the speaker positioned to provide audio content to a user of the electronic device; and identifying, by executing an instruction with the processor, the tone based when the speaker is not in use.

In some of Examples 1-52, the tone is a high pitch tone. In some of Examples 1-52, the tone is a low pitch tone. In some of Examples 1-52, the tone is a combination of a tones including high pitches and/or low pitches.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. A system to reshape fan noise of a fan of an electronic device, the system comprising:
   a microphone to detect a first acoustic signal including the fan noise;
   machine readable instructions;
   at least one processor circuit to be programmed by the machine readable instructions to:
      identify a tone in the first acoustic signal;
      identify a critical band adjacent the tone;
      calculate a prominence ratio for the tone; and
      determine a gain to add to the critical band of the first acoustic signal to mask the tone, the gain based on the prominence ratio; and
   a sound transducer to present a second acoustic signal including the gain.

2. The system of claim 1, wherein the microphone is coupled to a housing of the fan in an interior of the electronic device.

3. The system of claim 1, wherein the microphone is at or near an output region of the fan.

4. The system of claim 1, wherein the microphone is a first microphone and the system includes a second microphone to detect the first acoustic signal.

5. The system of claim 1, wherein the sound transducer is coupled to a housing of the fan in an interior of the electronic device.

6. The system of claim 1, wherein the sound transducer is a dynamic speaker.

7. The system of claim 1, wherein the sound transducer is a balanced armature.

8. The system of claim 1, wherein the critical band is a first critical band, and one or more of the at least one the processor circuit is to:
   identify a second critical band adjacent the tone;
   calculate the prominence ratio for the tone based on the first critical band and the second critical band;
   compare the prominence ratio to a threshold; and
   determine the gain to add when the prominence ratio does not satisfy the threshold, the gain including a first gain to be applied to the first critical band and a second gain for to be applied to the second critical band.

9. The system of claim 1, wherein one or more of the at least one processor circuit is to adjust the gain based on a location of at least one of the fan, the microphone, or the sound transducer.

10. The system of claim 1, wherein one or more of the at least one processor circuit is to adjust the gain based on a relative positioning among the fan, the microphone, and the sound transducer.

11. The system of claim 1, wherein one or more of the at least one processor circuit is to adjust the gain to change a color of the noise.

12. The system of claim 1, wherein one or more of the at least one processor circuit is to:
   access data indicative of when a speaker of the electronic device is in use, the speaker to provide audio content to a user of the electronic device; and
   identify the tone based on when the speaker is not in use.

13. An electronic device, comprising:
   a microphone to detect a first acoustic signal including fan noise;
   at least one processor circuit to:
      access data indicative of a presence of a human near the electronic device;
      identify a tone in the first acoustic signal based on the presence; and
      determine a gain to add to at least one frequency band of the first acoustic signal to mask the tone; and
   a sound transducer to present a second acoustic signal including the gain.

14. An electronic device, comprising:
   means for detecting a first acoustic signal including fan noise;
   means for processing the first acoustic signal, the processing means to:
      identify a tone in the first acoustic signal;
      identify a critical band adjacent the tone;
      calculate a prominence ratio for the tone; and
      determine a gain to add to the critical band of the first acoustic signal to mask the tone, the gain based on the prominence ratio; and
   means for generating a second acoustic signal including the gain.

15. The electronic device of claim 14, wherein the detecting means is coupled to a housing of the fan in an interior of the electronic device.

16. The electronic device of claim 14, wherein the detecting means is positioned at or near an output region of the fan.

17. The electronic device of claim 14, wherein the detecting means includes two microphones to detect the first acoustic signal.

18. The electronic device of claim 14, wherein the generating means is coupled to a housing of the fan in an interior of the electronic device.

19. The electronic device of claim 14, wherein the generating means includes a dynamic speaker.

20. The electronic device of claim 14, wherein the generating means includes a balanced armature.

21. The electronic device of claim 14, wherein the critical band is a first critical band, and the processing means is to:
 identify a second critical band adjacent the tone;
 calculate the prominence ratio for the tone based on the first critical band and the second critical band;
 compare the prominence ratio to a threshold; and
 determine the gain to add when the prominence ratio does not satisfy the threshold, the gain including a first gain for the first critical band and a second gain for the second critical band.

22. The electronic device of claim 15, wherein the processing means is to adjust the gain based on a location of at least one of the fan, the detecting means, or the generating means.

23. The electronic device of claim 15, wherein the processing means is to adjust the gain based on a relative positioning among the fan, the detecting means, and the generating means.

24. The electronic device of claim 15, wherein the processing means is to adjust the gain to change a color of the noise.

25. The electronic device of claim 15, wherein the processing means is to:
 access data indicative of when a speaker of the electronic device is in use, the speaker to provide audio content to a user of the electronic device; and
 identify the tone based on when the speaker is not in use.

26. A system to reshape fan noise of a fan of an electronic device, the system comprising:
 means for detecting a first acoustic signal including fan noise;
 means for processing the first acoustic signal, the processing means to:
  access data indicative of a presence of a human near the electronic device;
  identify a tone in the first acoustic signal based on the presence; and
  determine a gain to add to a frequency band of the first acoustic signal to mask the tone; and
 means for generating a second acoustic signal including the gain.

* * * * *

UNITED STATES PATENT AND TRADEMARK OFFICE
CERTIFICATE OF CORRECTION

PATENT NO. : 12,081,952 B2
APPLICATION NO. : 17/111130
DATED : September 3, 2024
INVENTOR(S) : Kulkarni et al.

It is certified that error appears in the above-identified patent and that said Letters Patent is hereby corrected as shown below:

In the Claims

Column 20, Line 9, Claim 8, Delete "at least one the" and Insert --at least one--.

Column 20, Line 19, Claim 8, Delete "for".

Column 21, Line 20, Claim 22, Delete "claim 15," and Insert --claim 14,--.

Column 21, Line 24, Claim 23, Delete "claim 15," and Insert --claim 14,--.

Column 22, Line 1, Claim 24, Delete "claim 15," and Insert --claim 14,--.

Column 22, Line 4, Claim 25, Delete "claim 15," and Insert --claim 14,--.

Signed and Sealed this
Fifteenth Day of October, 2024

Katherine Kelly Vidal
*Director of the United States Patent and Trademark Office*